May 13, 1969 A. J. LEIDICH 3,444,476

DIRECT COUPLED AMPLIFIER WITH FEEDBACK FOR D.C. ERROR CORRECTION

Filed March 19, 1965 Sheet 1 of 3

INVENTOR.
ARTHUR J. LEIDICH
BY John V. Regan
Attorney

INVENTOR.
ARTHUR J. LEIDICH
BY John V. Regan
Attorney

INVENTOR.
ARTHUR J. LEIDICH
BY John V. Regan
Attorney

United States Patent Office 3,444,476

Patented May 13, 1969

3,444,476

DIRECT COUPLED AMPLIFIER WITH FEEDBACK FOR D.C. ERROR CORRECTION

Arthur J. Leidich, New Brunswick, N.J., assignor to Radio Corporation of America, a corporation of Delaware Filed Mar. 19, 1965, Ser. No. 441,090

Int. Cl. H03f *1/34, 3/42*

U.S. Cl. 330—69 17 Claims

ABSTRACT OF THE DISCLOSURE

A direct coupled differential amplifier having a direct coupled feedback path to stabilize transistor base-emitter junction variations and other variations, such as power supply fluctuations, is described. According to one feature, the feedback path is from the common emitter connection of the subsequent stage to a common load impedance element in the preceding stage. According to another feature, D.C. feedback is accomplished in a single differential stage having a constant current source transistor by coupling undesirable D.C. signals from the common emitter point of the differential stage by way of the base-emitter junction of a feedback transistor to the base or control input of the constant current source transistor.

Figure 1:
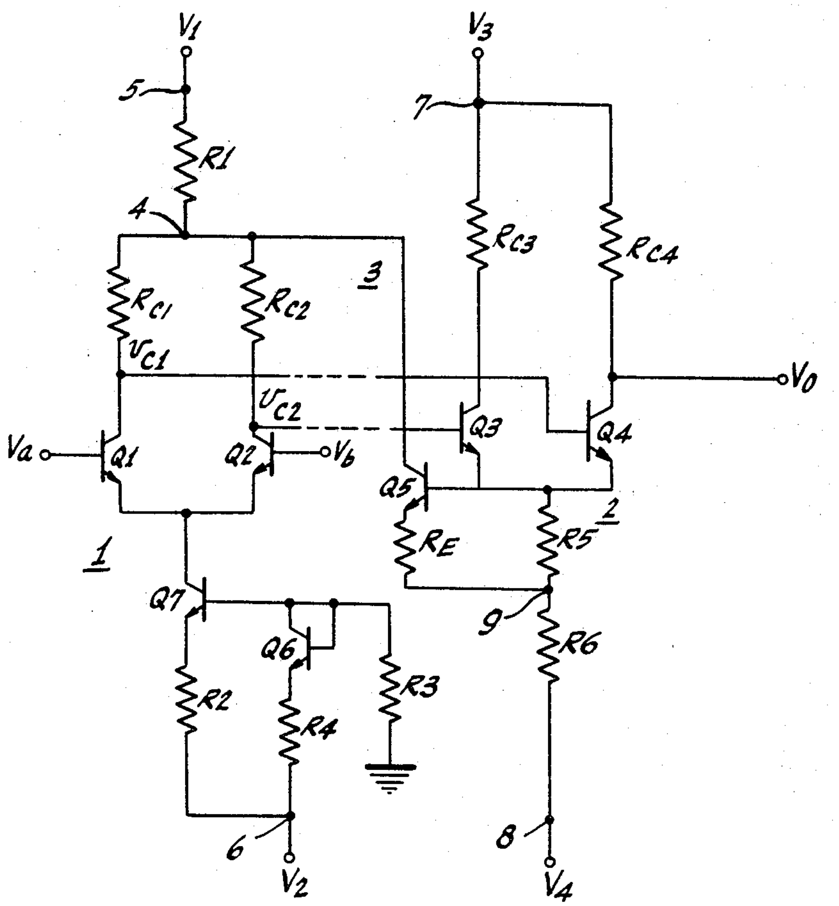

This invention relates to electronic circuitry, and more particularly to amplifiers.

One type of amplifier, a differential amplifier, has a principal function of amplifying the difference between two input signals applied to two different input terminals while attempting to prevent any ambiguous output signals from arising. Ambiguous output signals may arise either from mismatch of circuit components or from undesirable common mode signals. The ambiguous output signals may be minimized by utilizing negative feedback so that mismatch error signals and common mode signals tend to be cancelled.

For many applications, a differential amplifier should also be capable of minimizing drift due to supply voltage variations; for example, direct-coupled cascade amplifiers. A disadvantage of many prior art amplifiers is that they are somewhat sensitive to drift of the supply voltage and hence may require complex supply voltage circuitry.

It is an object of this invention to provide a differential amplifier with a feedback connection which minimizes the undesirable effects of ambiguous output signals and which minimizes drift due to supply voltage variations.

It is another object of this invention to provide a differential amplifier with a negative feedback connection to a common load impedance in the output portion of one stage of the amplifier.

It is still another object of this invention to provide a feedback circuit which minimizes the undesirable effects of ambiguous output signals in a single stage differential amplifier.

In accordance with this invention there is provided in a differential amplifier circuit having at least first and second differential amplifier stages a feedback connection which minimizes both drift due to supply voltage variation and the amplification of ambiguous signals. Feedback is accomplished by feeding the signal developed at the common electrode connection in the second differential stage to a common load impedance element in the first stage.

Each differential stage in the amplifier circuit includes first and second amplifying devices each having input, output and common electrode means. The output of the first stage includes the output means of each amplifying device coupled by way of separate load impedances to a common load impedance. Separate load impedances are coupled to the respective output means of each second stage amplifying device. In each stage, the common electrode means of each amplifying device are coupled together and to a current determining element. The output means of each amplifying device in the first stage are further coupled to the input means of the amplifying devices in the second stage.

In another embodiment of the invention a feedback connection minimizes undesirable effects of ambiguous output signals for a single stage of a differential amplifier. The current determining element for the differential amplifier stage is an amplifying device having its output coupled to the common electrode connection of the differential amplifier stage and its common electrode means coupled to a supply voltage. The feedback circuit includes an amplifying device having its output coupled to a supply voltage, its input coupled to the common electrode connection of the differential amplifier stage and its common electrode means coupled to the input means of the current determining amplifying device.

Figure 2A:
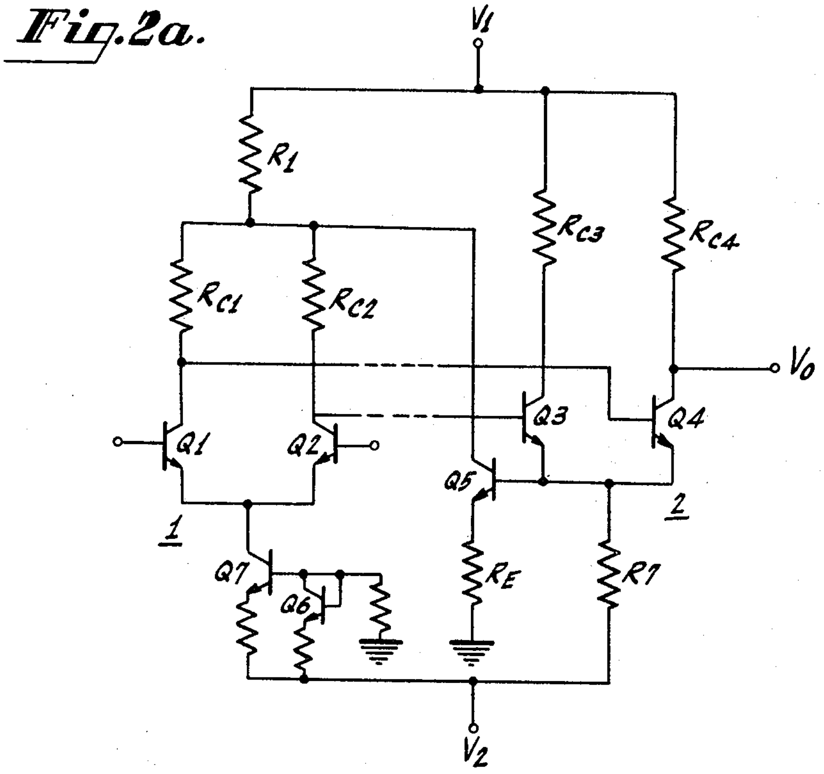
Figure 2B:
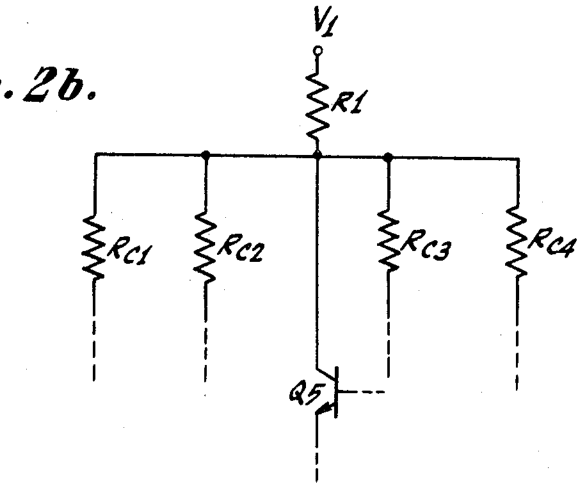
Figures 3, 4:
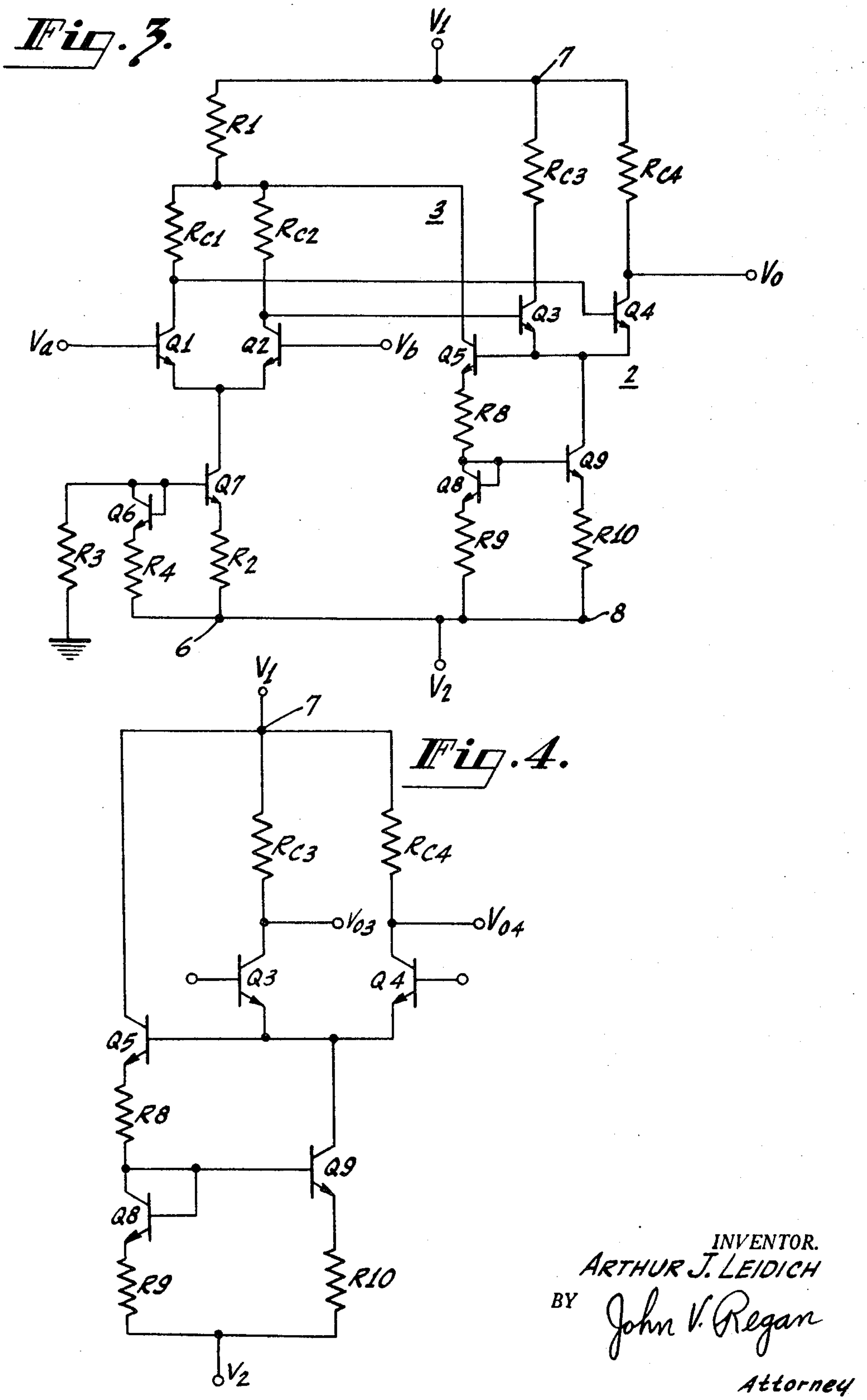

In the drawings:

FIG. 1 is a circuit diagram of a multi-stage amplifier having a feedback connection from a second differential stage to a first differential stage;

FIGS. 2A and B are circuit diagrams of alternative connections for the feedback circuit of FIG. 1;

FIG. 3 is a circuit diagram of another multi-stage amplifier having feedback circuits similar to those shown in FIGS. 1 and 2; and FIG. 4 is a circuit diagram of the succeeding differential stage of FIG. 3 for a double-ended input and output application.

In FIG. 1 first and second differential stages 1 and 2, respectively, of the illustrated multi-stage amplifier arrangement have a feedback circuit 3. The dotted connections between stages 1 and 2 illustrate that there may be further differential stages connected therebetween. Moreover, there may be differential stages which precede or succeed stages 1 and 2 of the illustrated amplifier arrangement. For purposes of illustration the active amplifying devices in each stage and in the feedback circuit are shown as bipolar transistors having bases, collectors and emitters corresponding to inputs, outputs and common electrodes respectively of the amplifying devices. It is apparent that the amplifying devices may be field-effect type devices having gates, drains and sources corresponding to input, output and common electrodes. Examples of known types of field-effect devices are the thin film transistor (TFT) and the metal oxide semiconductor (MOS). Some of the physical and operating characteristics of a thin film transistor are described in an article by P. K. Weimer, entitled, "The TFT–A New Thin Film Transistor," appearing at pages 1462–1469 of the June 1962 issue of the Proceedings of the IRE. The MOS field-effect device is described in an article entitled, "The Silicon Insulated-Gate Field-Effect Transistor," by S. R. Hofstein and F. P. Heiman, appearing at pp. 1190–1202 of the September 1963 issue of the Proceedings of the IEEE.

In the first differential stage, transistors Q1 and Q2 have their collectors connected by way of separate load impedance devices RC1 and RC2 to a common connection 4. A common load impedance element R1 couples the common connection 4 to a first power electrode 5 of the first stage. Input signals $V_a$ and $V_b$ may be applied to the bases of transistors Q1 and Q2. The emitters of transistors Q1 and Q2 are connected in common to the collector of current determining transistor Q7. The emitter of transistor Q7 is connected by way of a resistor R2 to a second power electrode 6 of the differential stage. The base of current determining transistor Q7 is connected by way of a resistor R3 to a reference voltage level. The reference voltage level may be arbitrarily regarded as a ground reference indicated in FIG. 1 by the conventional ground symbol. The base of transistor Q7 is also connected to the base and collector of transistor Q6. The emitter of transistor Q6 is connected by way of a resistor R4 to the second power electrode 6.

Since the base and collector of transistor Q6 are connected together, the base-emitter junction of transistor Q6 is operative as a diode. The series connection of the base-emitter junction diode of transistor Q6 and resistor R4 between the base of transistor Q7 and the second power electrode 6 provides temperature compensation for transistor Q7. Transistors Q6 and Q7 preferably are integrated in the same piece of semiconductor material. Since this temperature compensation network is not part of the present invention, no further description is necessary. However, reference is made to U.S. Patent No. 2,951,208 issued to L. E. Barton for a more detailed description of the operation of the temperature compensation network.

In the second differential stage transistors Q3 and Q4 have their collectors coupled by way of separate load impedance devices RC3 and RC4 to a first power electrode 7. The emitters of transistors Q3 and Q4 are coupled in a common electrode connection to one terminal of a resistor R5. The other terminal of the resistor R5 is connected by way of resistor R6 to a second power electrode 8. Either a single ended or double ended output may be taken form the collectors of transistors Q3 and Q4. For purposes of illustration a single ended output $V_0$ is illustrated as being connected to the collector of transistor Q4.

The outputs of the first differential stage are coupled to the inputs of the second differential stage by connecting the collectors of transistors Q1 and Q2 to the bases of transistors Q4 and Q3, respectively. Separate supply voltages V1 and V3 are coupled to the first power terminals 5 and 7, respectively; and separate supply voltages V2 and V4 are coupled to the second power terminals 6 and 8, respectively. Alternatively, supply voltages V1 and V3 may be the same source; and supply voltages V2 and V4 may be the same source. The bases of transistors Q1 and Q2 may be connected by way of separate resistances (not shown) to some reference potential, such as ground.

In the feedback circuit transistor Q5 has its base connected to the common electrode connection of the emitters of transistors Q3 and Q4. The emitter of transistor Q5 is connected by way of resistor $R_E$ to the junction of resistors R5 and R6. The collector of transistor Q5 is connected to the common load impedance element R1 at common connection 4.

The values of the supply voltage V2 and the values of resistors R2, R3 and R4 are selected so that in the quiescent condition current determining transistor Q7 is conducting to supply a constant current to the common electrode connection of transistors Q1 and Q2. Transistors Q1 and Q2 are forward biased so that the constant current divides equally through the two parallel paths provided by transistor Q1 and RC1 and transistor Q2 and RC2. A D.C. voltage level is established at the collectors of transistors Q1 and Q2 and at the bases of transistors Q3 and Q4, biasing the latter two transistors into conduction. The relative values of resistors R5 and R6 are selected so that the current conducted by transistors Q3 and Q4 provides a voltage across resistor R5 which forward biases transistor Q5 into an appropriate operating condition. For one particular application transistor Q5 is forward biased into its linear operating range. The current determining transistor Q7 and the series connected resistors R5 and R6 perform similar circuit functions in that each provides a current path for its respective differential stage and determines the current flow through the stage. Transistor Q7 additionally performs the function of maintaining a substantially constant current flow.

Drift of the D.C. voltage level at the collectors of transistors Q1 and Q2 and at the bases of transistors Q3 and Q4 due to a variation of the supply voltage V1 is minimized by the feedback circuit 3 in the following manner. If supply voltage V1 goes more positive, the collectors of transistors Q1 and Q2 tend to go more positive, increasing the D.C. voltage level at the bases of transistors Q3 and Q4. The common emitter connection of transistors Q3 and Q4 tends to go more positive pulling the base of transistor Q5 more positive. Transistor Q5 tends to conduct more current resulting in a large voltage drop across common load impedance element R1, which voltage drop tends to decrease and thereby minimize drift of the D.C. voltage level at the collectors of transistors Q1 and Q2 due to a variation of supply voltage V1. On the other hand, if supply voltage V1 goes more negative, the feedback circuit 3 reacts in an opposite manner tending to lessen the voltage drop across R1 and thereby minimizing drift of the D.C. voltage level.

If supply voltage V2 goes more positive, transistor Q7 tends to conduct more current, resulting in larger voltage drops across RC1 and RC2. The D.C. voltage level at the collectors of transistors Q1 and Q2 and at the bases of transistors Q3 and Q4 tends to go more negative. The emitters of transistors Q3 and Q4 also tend to go more negative driving the base of transistor Q5 more negative. Transistor Q5 tends to conduct less current resulting in a smaller voltage drop across common load impedance element R1 which tends to increase the D.C. voltage level at the collectors of transistors Q1 and Q2. On the other hand, if supply voltage V2 goes more positive, the feedback circuit 3 reacts in an opposite manner tending to increase the voltage drop across common load impedance element R1 thereby minimizing drift of the D.C. voltage level.

In addition to minimizing drift due to supply voltage variations, feedback circuit 3 also tends to cancel signal magnitude unbalance in the first differential stage caused by mismatch of load impedances RC1 and RC2 or by mismatch of voltage amplification of transistors Q1 and Q2. If the circuit elements, transistor Q1 and impedance RC1 are perfectly matched with transistor Q2 and impedance RC2, differential mode signals at the collectors of transistors Q1 and Q2 are equal in magnitude and 180° out of phase relative to one another. For a perfect match of circuit components, it is apparent that feedback circuit 3 has little or no effect on differential mode signals since the common electrode connection of the emitters of transistors Q3 and Q4 is like a virtual A.C. ground with respect to differential mode signals. In other words, the common electrode connection of transistors Q3 and Q4 is like the midpoint of an impedance coupled between the collectors of transistors Q1 and Q2.

Practically, it is not always possible to obtain perfect matches of the circuit components. Thus, with either a mismatch of impedances RC1 and RC2 or of transistors Q1 and Q2, the differential mode signals $v_{c1}$ and $v_{c2}$ at the collectors of transistors Q1 and Q2 may be unequal in magnitude. Considering that the signal magnitude at the collector of transistor Q1 ($v_{c1}$) is larger than the signal magnitude ($v_{c2}$) at the collector of transistor Q2, the emitter connection of transistors Q3 and Q4 is not an A.C. virtual ground with respect to the difference between the absolute magnitudes of the two signals. This undesirable difference signal is in phase with the larger ($v_{c1}$) and 180° out of phase with the smaller ($v_{c2}$) of the two differential mode signals. The difference signal is inverted and amplified by feedback transistor Q5 so that it appears across common load impedance element R1 in phase with the smaller ($v_{c2}$) and 180° out of phase with the larger ($v_{c1}$) of the two differential mode signals. Consequently, the feedback difference signal tends to add to the smaller ($v_{c2}$) and subtract from the larger ($v_{c1}$) of the differential mode signals, thereby tending to cancel the undesirable difference signal.

The feedback circuit 3 also responds in a like manner tending to cancel undesirable signals when the gain of one of the two transistors Q1 or Q2 drops off with frequency before the other. Consider that the gains of transistors Q1 and Q2 begin to drop off at frequencies $f1$ and $f2$ respectively, where $f1<f2$. When a differential mode signal having a frequency greater than frequency $f1$ but less than frequency $f2$ is applied to the bases of transistors Q1 and Q2, the magnitude of the signal at the collector of transistor Q2 is larger than the magnitude of the signal of the collector of transistor Q1. The difference between the two signal magnitudes appears at the emitters of transistors Q3 and Q4 and is in phase with the larger signal magnitude. Transistor Q5 amplifies and inverts this signal so that it appears across common impedance element R1 in phase with the smaller signal magnitude and out of phase with the larger signal magnitude. Consequently, the feedback signal adds to the magnitude of the smaller signal and subtracts from the magnitude of the larger signal, thereby tending to compensate for the unequal drop off frequencies.

Although input signals $V_a$ and $V_b$ may be intended to be differential mode signals, it is sometimes inevitable that $V_a$ and $V_b$ include undesirable components which are in the common mode. Output signals which may arise from the common mode components are minimized by negative feedback of the common mode signal. The current determining transistor Q7 in the first stage and resistors R5 and R6 in the second stage, in addition to performing current determining functions, also perform negative feedback functions to partially reduce the common mode gain of the amplifier. Ideally, the impedance connected to the common electrode connection of a differential amplifier stage should be infinite. Practically this is not possible. Consequently, ambiguous output signals may arise from common mode signals, especially where there is more than one stage of amplification. These ambiguous output signals are minimized in FIG. 1 by feedback circuit 3 which reduces the common mode gain of the amplifier by feeding back a common mode signal appearing in a second stage in a degenerative fashion to a common load impedance element in the first stage of the amplifier.

If a negative common mode signal is applied to the bases of transistors Q1 and Q2, the common mode signal appears as a positive signal at the collectors of transistors Q1 and 2 and at the bases of transistors Q3 and Q4. The positive common mode signal also appears at the emitters of transistors Q3 and Q4 and at the base of transistor Q5. Transistor Q5 amplifies and inverts this positive common mode signal and applies it to the common load impedance element R1 in the first differential stage. Since the common mode signal appearing at the collectors of transistors Q1 and Q2 is positive, the feedback common mode signal, being inverted, tends to buck or cancel the common mode signal at the collectors of the two transistors thereby minimizing the common mode gain of the amplifier. The degree of common mode gain reduction is a function of the gain or amplification of transistor Q5. If resistor $R_E$ is zero, the gain of transistor Q5 is limited only by resistor R5.

Although the invention has been illustrated with a single stage of amplification in the feedback circuit, it is apparent to those skilled in the art that a cascade amplifier may be connected in the feedback circuit so long as the feedback is negative. In general, where the entire amplifier includes an even number of stages between stages 1 and 2, an odd number of cascaded amplifiers of the inverting type is required in the feedback circuit; whereas an even number of inverting type amplifiers is required in the feedback circuit for an odd number of differential stages coupled between stages 1 and 2.

The circuit of FIG. 2A is identical to the circuit of FIG. 1 except for the connections to the emitters of transistors Q3, Q4 and Q5. The emitters of transistors Q3 and Q4 are connected to the supply voltage V2 by way of resistor R7; while resistor $R_E$ connects the emitter of transistor Q5 to ground. Current determining element R7 may also be a constant current source transistor either with an independent D.C. base biasing network or with the same network used for biasing the base of transistor Q7, that is, the base of the constant current source can be common with the base of transistor Q7. Insofar as common mode gain is concerned, this particular circuit configuration has an advantage over the circuit in FIG. 1 in that when resistor $R_E$ equals zero, the gain of transistor Q5 is optimum. This is in contrast to the circuit of FIG. 1 wherein the gain of transistor Q5 is limited by resistor R5.

Among other alternatives for the connections of resistors $R_E$ and R7 of FIG. 2A both resistors $R_E$ and R7 can be grounded. Another alternative is to connect both resistor $R_E$ and R7 to supply voltage V2.

Common impedance element R1 in RIGS. 1 and 2A can alternatively be connected in common between the impedances RC1, RC2, RC3 and RC4 and the supply voltage V1 as illustrated in FIG. 2B. Drift of the D.C. level due to supply voltage variations is minimized by this alternative connection. Although the alternative connection does not provide common mode feedback, this would not be serious in some applications.

In the amplifier circuit in FIG. 3, the first differential stage is identical to the first differential stage in FIGS. 1 and 2. The second differential stage is similar to the second differential stage of FIGS. 1 and 2. The emitter resistor $R_E$ of transistor Q5 in FIGS. 1 and 2 is replaced by a voltage divider arrangement consisting of resistors R8 and R9 and the base emitter junction of transistor Q8. The common electrode resistor R7 in FIG. 2 is replaced by a current source transistor Q9. The collector of transistor Q9 is connected to the base of transistor Q5 and to the common electrode connection of the emitters of transistors Q3 and Q4. The emitter of transistor Q9 is connected by way of resistor R10 to supply voltage V2. The base of transistor Q9 is connected to the base and collector of transistor Q8 and to resistor R8.

Feedback circuit 3 is operative in the same manner as described in conjunction with FIGS. 1 and 2 to minimize drift due to supply voltage variation and common mode gain in the first differential stage. There is an additional feedback circuit in the second differential stage consisting of the base emitter junction of transistor Q5, resistor R8 and transistor Q9. This feedback circuit is operative to minimize drift and common mode gain in the second differential stage.

The additional feedback circuit minimizes drift due to supply voltage variation in the second differential stage in the following manner. If supply voltage V1 goes more positive, the collectors and emitters of transistor Q3 and Q4 also tend to go more positive. The base and emitter of transistor Q5 also tend to go more positive as does the base of transistor Q9. Transistor Q9 conducts more current resulting in larger voltage drops across the impedances RC3 and RC4 tending to decrease the D.C. voltage level at the collectors of transistors Q3 and Q4. On the other hand, if supply voltage V1 goes more negative, the circuit reacts in an opposite manner tending to lessen the voltage drops across impedances RC3 and RC4 thereby minimizing drift of the D.C. voltage level.

If the supply voltage V2 goes more negative, the emitter of transistor Q9 goes more negative than does its base so that transistor Q9 tends to conduct more current. The larger current results in larger voltage drops across impedances RC3 and RC4, tending to decrease the D.C. voltage at the collectors and emitters of transistors Q3 and Q4. The base and emitter of transistor Q5 tend to go more negative as does the base of transistor Q9. Consequently, as the emitter of transistor Q9 goes negative with a negative variation of supply voltage V2, the feedback circuit is operative to also drive the base of transistor Q9 more negative thereby tending to minimize drift of the D.C. voltage level. On the other hand, if supply voltage V2 goes more positive, the circuit reacts in an opposite manner to minimize drift of the D.C. voltage level.

The additional feedback circuit is also operative to reduce common mode gain in the second differential stage. If a common mode signal appears at the emitters of transistors Q3 and Q4, transistor Q5 is operative as an emitter follower so that a signal which is in phase with and proportional to the common mode signal appears at the base of transistor Q9. This signal is amplified and inverted by transistor Q9 so that it is applied to the emitters of transistors Q3 and Q4 to minimtze common mode signal appearing at that connection.

Although either a single ended or double ended output may be taken from the collectors of transistors Q3 and Q4, for purposes of illustration a single ended output $V_0$ is connected to the collector of transistor Q4. If the D.C. voltage level at the collector of transistor Q4 is not comptaible with the voltage level of the output circuitry, appropriate D.C. level changing circuitry is required. In such case, use may be made of the D.C. signal at the base of transistor Q9 for bucking the D.C. signal at the collector of transistor Q4.

For double ended input and output applications, the second differential stage of FIG. 3 can be used as a differential amplifier by connecting the collector of transistor Q5 to the supply voltage V1 as illustrated in FIG. 4. The circuit operates in much the same manner as described in connection with FIG. 3.

Although the invention has been illustrated in FIGS. 1, 2 and 3 with NPN type transistors, it is apparent that PNP type transistors could be used. In the case where field effect type devices are used, it is apparent that either enhancement type or depletion type field effect devices may be used. It is also apparent that the load impedances RC1, RC2, RC3 and RC4 may be either resistors or active element loads such as transistors.

What is claimed is:

1. A circuit comprising first, second, third, and fourth amplifying devices each having an input, an output and a common electrode means;

input circuit means including connections to the input electrode means of the first and second devices, separate load impedances each having first and second terminals, the first terminals of the impedances being coupled to different ones of the output electrode means of said first and second amplifying devices, the common electrode means of said first and second devices, the input means of said third device and the output electrode means of said fourth device being coupled together, one of the common electrode means and the output electrode means of said third amplifying device being coupled to the input electrode means of said fourth amplifying device, and operating power terminal means adapted to receive operating power, said terminal means including connections to the second terminals of said load impedances, to the common electrode means of the fourth device and to the other one of the common electrode means and the output electrode means of the third device.

2. The combination comprising:

a plurality of differential amplifier stages, each stage including first and second amplifying devices each having an input, an output and a common electrode means, a current determining element having a plurality of terminals, a first circuit node, and first and second load impedances, each having first and second terminals; in each stage the first terminals of the first and second load impedances being coupled to different ones of the output electrode means of the first and second devices, said first circuit node in each stage being coupled to the common electrode means of the corresponding first and second devices and to a first terminal of the plurality terminals of the corresponding current element;

direct coupling means for coupling said stages in cascade, said means coupling the output electrode means of the first and second devices in each stage, except the last, to the input electrode means of the first and second devices, respectively, in the next succeeding stage;

input terminal means including connections to the input electrodes of the first and second devices in the first stage of said cascaded stages;

a second circuit node and a common load impedance element having a plurality of terminals, said second circuit node being coupled to the second terminals of the first and second load impedances in one of the cascade stages which precedes the last of said cascaded stages and to a first terminal of the plural terminals of the common load impedance element;

feedback means including a direct coupled feedback path coupled between the first circuit node in one of the cascaded stages which is subsequent to the preceding stage and one of the plural terminals of said common load impedance element; and operating power terminal means including connections to a second terminal of the plural terminals of the common load impedance element, to a second terminal of the plural terminals of the current determining element in each stage, and to the second terminals of the first and second load impedances in all of the stages except for said preceding stage.

3. The invention according to claim 2:

wherein said feedback means includes an amplifier means having an input direct coupled to said subsequent stage first circuit node and an output direct coupled to said one of the plural terminals of the common load impedance element.

4. The invention according to claim 3:

wherein said feedback amplifier means is a feedback amplifying device having an input and an output electrode means corresponding to the amplifier input and output, respectively, and further having a common electrode means coupled to a third terminal of the plural terminals of the current determining element of said subsequent stage.

5. The invention according to claim 4:

wherein said one of the plural load impedance element terminals corresponds to said first terminal thereof.

6. The invention according to claim 5:

wherein the current determining element in said subsequent stage is a current amplifying device having an input, an output and a common electrode means corresponding respectively to said third, first and second terminals thereof.

7. The invention according to claim 6:

wherein each of said amplifying devices is a transistor having a base, an emitter and a collector electrode, corresponding to the device input, common and output electrode means, respectively.

8. The combination comprising:

first and second amplifying devices each having an input, an output and a common electrode means, input terminal means including connections to the input electrode means of said first and second devices, a pair of load impedances for coupling the respective output electrode means of said first and second devices to a first circuit node, a common load impedance element having a plurality of terminals, a first terminal of which is coupled to said first circuit node, a current determining element having first and second terminals, the first terminal thereof being coupled to the common electrode means of both said first and second devices, an impedance means having first, second and third terminals and an inverter device having an input and an output, direct coupling means including first means for coupling the first and second terminals of said impedance means across the output electrode means of the first and second devices, respectively, and further including second means for coupling said inverter device output to one of the plural terminals of said common load impedance and for coupling said inverter device input to the third terminal of said impedance means, and operating power terminal means including connections to a second terminal of the plural terminals of the common load impedance element and to the second terminal of the current determining element.

9. The invention according to claim 8:

wherein said first and second devices are first and second transistors each having a base, a collector and an emitter electrode corresponding to the input, output and common electrode means, respectively, wherein third and fourth transistors are provided each having a base and an emitter electrode to define a base-emitter junction, the emitter electrodes of the third and fourth transistors being commonly coupled, wherein said impedance means include the base-emitter junctions of said third and fourth transistors, the base electrodes of the third and fourth transistors corresponding to the first and second terminals, respectively, of said impedance means and the common emitter connection of the third and fourth transistors corresponding to the third terminal of the impedance means, and wherein said one of the plural common load impedance element terminals corresponds to said first terminal thereof.

10. The invention according to claim 9:

wherein said inverter device is a fifth transistor having a base, an emitter and a collector electrode, the fifth transistor base and collector electrodes corresponding to the inverter input and output, respectively, and wherein said power terminal means includes a further connection coupled to the emitter electrode of the fifth transistor.

11. The invention according to claim 10:

wherein the said power terminal means further connection is coupled by way of a resistor to the fifth transistor emitter electrode.

12. The invention according to claim 9:

wherein said inverter device is a fifth transistor having a base, an emitter and a collector electrode, said third and fourth transistors each having a collector electrode, the base and collector electrodes of the fifth transistor corresponding to the inverter device input and output, respectively, wherein another pair of load impedances each having first and second terminals and another current determining element having first, second and third terminals are provided, the first terminal of said another current element being coupled to said common connection of the third and fourth transistors and the first terminals of said other pair of load impedances being coupled to different ones of the collector electrodes of the third and fourth transistors, wherein the fifth transistor emitter electrode is connected in circuit with the third terminal of said another current determining element, and wherein said power terminal means includes further connections to the second terminal of said another current determining element and to the second terminals of said another load impedance pair.

13. The invention according to claim 12:

wherein said another current determining element is a sixth transistor having a base electrode, a collector electrode and an emitter electrode corresponding to said another current element third, first and second terminals, respectively.

14. The invention according to claim 13:

wherein a source of operating power is connected to said operating power terminal means.

15. The combination comprising:

first, second and third transistors each having a base, an emitter and a collector electrode, a P–N junction of semiconductor material, means coupling the emitter electrodes of the first and second transistors an dthe collector electrode of the third transistor together at a first circuit node, means coupling the P–N junction between the first circuit node and the third transistor base electrode, input circuit means including connections to the first and second transistor base electrodes, and operating power terminal means including connections to the first and second transistor collector electrodes and to the third transistor emitter electrode.

16. The invention according to claim 15:

wherein said P–N junction is the base-emitter junction of a fourth transistor, the fourth transistor having a collector electrode coupled to a further connection of said terminal means.

17. The invention according to claim 16:

wherein a source of operating power is connected to said power terminal means.

References Cited

UNITED STATES PATENTS

| | | | |
|---|---|---|---|
| 2,929,026 | 3/1960 | Walker | 330—111 X |
| 2,960,662 | 11/1960 | Nelson | 330—128 |

NATHAN KAUFMAN, *Primary Examiner.*

U.S. Cl. X.R.

330—18, 30

PO-1050
(5/69)

UNITED STATES PATENT OFFICE
CERTIFICATE OF CORRECTION

Patent No. 3,444,476 Dated May 13, 1969

Inventor(s) A.J. Leidich

It is certified that error appears in the above-identified patent and that said Letters Patent are hereby corrected as shown below:

Column 4, line 18, "positive" should read --negative--.
Column 5, line 44, "2" should read --Q2--.
Column 6, line 14, "RIGS." should read --FIGS.--.
Column 7, line 15, "ptaible" should read --patible--.
Column 7, Claim 2, line 72, "plurality" should read --plural--.
Column 10, Claim 15, line 27, "an dthe" should read --and the--.

SIGNED AND
SEALED
MAY 5 1970

(SEAL)
Attest:

Edward M. Fletcher, Jr.
Attesting Officer

WILLIAM E. SCHUYLER, JR.
Commissioner of Patents